US006903989B2

(12) United States Patent
Jeong

(10) Patent No.: US 6,903,989 B2
(45) Date of Patent: Jun. 7, 2005

(54) DATA SENSING CIRCUITS AND METHODS FOR MAGNETIC MEMORY DEVICES

(75) Inventor: Gi-Tae Jeong, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/668,022

(22) Filed: Sep. 22, 2003

(65) Prior Publication Data

US 2004/0076029 A1 Apr. 22, 2004

(30) Foreign Application Priority Data

Oct. 7, 2002 (KR) .................................. 10-2002-0060923

(51) Int. Cl.[7] .................................................. G11C 7/02
(52) U.S. Cl. ........................ 365/209; 365/158; 365/207
(58) Field of Search ................................ 365/209, 158, 365/207

(56) References Cited

U.S. PATENT DOCUMENTS 6,525,978 B2 * 2/2003 Weber et al. ............... 365/209
6,661,708 B2 * 12/2003 Cernea et al. .............. 365/207
2003/0214868 A1 * 11/2003 Baker ......................... 365/207

* cited by examiner

Primary Examiner—Huan Hoang
(74) Attorney, Agent, or Firm—Myers Bigel Sibley & Sajovec

(57) ABSTRACT

Data sensing circuits for a magnetic memory cell include a current source circuit that selectively supplies a current to the magnetic memory cell. A first storage device selectively coupled to the magnetic memory cell stores a voltage representing a state of the magnetic memory cell. A second storage device selectively coupled to the magnetic memory cell stores a voltage representing a state of the magnetic memory cell. A differential voltage sense circuit coupled to the first and second storage device that is configured to generate a sensed data output signal for the magnetic memory cell responsive to sensing a difference between voltages stored in the first and second storage devices. A control circuit generates control signals to control the current source to supply current to the magnetic memory cell and to control the coupling of the first and second storage devices to the magnetic memory cell. Magnetic memories and methods are also provided.

22 Claims, 8 Drawing Sheets

DATA SENSING CIRCUITS AND METHODS FOR MAGNETIC MEMORY DEVICES

RELATED APPLICATION

This application claims the benefit of Korean Patent Application No. 2002-60923, filed on Oct. 7, 2002, which is incorporated herein in its entirety by reference.

BACKGROUND OF THE INVENTION

The present invention relates to integrated circuit devices and, in particular, to data sensing circuits and methods for integrated circuit devices.

Integrated circuit devices include a variety of different memory devices. A magnetic random access memory (hereinafter, referred to as "MRAM") is a type of non-volatile memory that includes a plurality of magnetic memory cells. A MRAM generally provides a form of non-volatile storage based on a magnetoresistive behavior provided between multiple layers consisting of alternately stacked magnetic and non-magnetic layers. The magnetoresistance of such a magnetic memory cell typically has a minimum value when magnetizations of the magnetic layers are in the same direction and a maximum value when magnetizations of the magnetic layers are in opposite directions. The former state may be referred to as "parallel" and may be associated with a logic low level (also referred to herein as a "0" state). The latter state may be referred to as "anti-parallel" and may be associated with a logic high level (also referred to herein as a "1" state).

FIG. 1 is a simplified sectional view of a magnetic tunnel junction (MTJ) of a memory cell. The illustrated MTJ 10 includes a first layer 11 of magnetic material and a second layer 12 of magnetic material with a thin insulating layer 13 therebetween. The sizes of the illustrated regions in FIG. 1 are selected for illustrative purposes only. A read current terminal 14 is electrically connected to the layer 11 and a read current terminal 15 is electrically connected to the layer 12. The layer 11 is constructed so that a magnetic field therein lies generally parallel with and in the direction of a vector 16. Similarly, the layer 12 is constructed so that a magnetic field therein lies generally parallel with and in the direction of a vector 17. For purposes of this description it will be assumed that vector 16 always remains in the direction illustrated (to the right of the page in FIG. 1) and vector 17 is switchable to either point to the left or to the right based on a desired programmed state of the MTJ 10.

A digit line 20 is positioned adjacent to the layer 12. When a current is passed through the digit line 20 a magnetic field is produced in the layer 12. The resulting magnetic field may be used to change the direction of vector 17. The direction of the current determines the direction of the magnetic field produced and, consequently, the resulting direction of the vector 17. In some applications it may be convenient to provide a second source of magnetic field, such as a bit line 21. As illustrated in FIG. 1, the bit line 21 is positioned adjacent to the layer 12 and extends into and out of the figure. In such applications, a current in both digit line 20 and bit line 21 may be required to switch the vector 17 in the layer 12. In programming or "write" modes, the two line embodiment may be convenient, for example, for addressing a specific memory cell in a two dimensional array of memory cells.

Generally, the MTJ 10 has two memory states, one in which the vectors 16 and 17 are aligned and the resistance between the terminals 14 and 15 is a minimum and one in which the vectors 16 and 17 are opposite or misaligned and the resistance between the terminals 14 and 15 is a maximum. There are a variety of ways in which the maximum and/or the minimum resistance values can be established. Known methods include varying the thickness of the layer 13 and/or varying the horizontal area of the layers 11, 12, and 13.

The resistance between the terminals 14 and 15 may be referred to as a tunneling resistance. As this tunneling resistance is generally exponentially varied with respect to a thickness of the insulation layer 13, the tunneling resistance may be significantly varied based on variations in the thickness of the insulation layer 13. The thickness of the insulation layer 13 generally should be maintained uniformly (e.g., below 0.1 Å variation) to provide a magnetoresistive ratio (MR) of 20%. Such a uniformity requirement may impose a burden on the manufacturing process for the memory device. As will be known by those of skill in the art, the MR is used to determine whether data stored in MTJ is a "1" or a "0."

A conventional MRAM typically includes reference memory cells corresponding to respective data memory cells. Data stored in a data memory cell is read (judged) by applying a sense current to a data memory cell and a reference current to a reference memory cell and then comparing voltages across the data and reference memory cells. As described above, however, a magnetoresistive difference between data and reference memory cells typically must be small to read data in a data memory cell correctly. If a magnetoresistive difference therebetween is large, an operational error may result.

SUMMARY OF THE INVENTION

According to some embodiments of the present invention, data sensing circuits for a magnetic memory cell include a current source circuit that selectively supplies a current to the magnetic memory cell. A first storage device selectively coupled to the magnetic memory cell stores a voltage representing a state of the magnetic memory cell. A second storage device selectively coupled to the magnetic memory cell stores a voltage representing a state of the magnetic memory cell. A differential voltage sense circuit coupled to the first and second storage device that is configured to generate a sensed data output signal for the magnetic memory cell responsive to sensing a difference between voltages stored in the first and second storage devices. A control circuit generates control signals to control the current source to supply current to the magnetic memory cell and to control the coupling of the first and second storage devices to the magnetic memory cell.

In further embodiments of the present invention, the current source circuit is configured to selectively apply a first current or a second current different from the first current responsive to a control signal from the control circuit. The current source circuit may include a plurality of transistors having serially connected current paths and gates connected to receive a first control signal. A first transistor has a gate connected to receive a second control signal. A second transistor is coupled to the plurality of transistors and the first transistor. A third transistor is coupled to the magnetic memory cell and has a gate coupled to a gate and a drain of the second transistor. The first current or the second current may be selected by selective activation of the first and second control signal.

In other embodiments of the present invention, the differential voltage sense circuit is a differential amplifier. A first switch transistor may selectively couple the first storage device to the magnetic memory cell and a second switch transistor may selectively couple the second storage device to the magnetic memory cell. The control circuit may be configured to generate control signals coupled to the switch transistors to control the coupling of the first and second storage devices to the magnetic memory cell. The first storage device may be a capacitor coupled to the first switch transistor and the second storage device may be a capacitor coupled to the second switch transistor.

In further embodiments of the present invention, the magnetic memory cell is a magnetic tunnel junction. The control circuit may be configured to selectively couple the first storage device to the magnetic memory cell to store a voltage representing a data state of the magnetic memory cell to be sensed and to selectively couple the second storage device to the magnetic memory cell to store a voltage representing a known data state of the magnetic memory cell. The control circuit further may be configured to select the first current when the first storage device is coupled to the magnetic memory cell and the second current when the second storage device is coupled to the magnetic memory cell. The first current may be lower than the second current and the voltage stored in the first storage device may be lower than the voltage stored in the second storage device when the data state of the magnetic memory cell corresponds to the known data state. The voltage stored in the first storage device may greater than the voltage stored in the second storage device when the data state of the magnetic memory cell differs from the known data state.

In other embodiments of the present invention, magnetic memory devices are provided including a plurality of magnetic memory cells and the data sensing circuit of the present invention.

In accordance with other embodiments of the present invention, a method of sensing data stored in a magnetic memory cell is provided which comprises supplying a first current to the magnetic memory cell to sense a first voltage corresponding to a resistance of the magnetic memory cell; storing a first data in the magnetic memory cell; supplying a second current to the magnetic memory cell to sense a second voltage corresponding to a resistance of the magnetic memory cell; and sensing data stored in the magnetic memory cell using a difference between the first voltage and the second voltage.

In some embodiments of the present invention, the judged data is rewritten in the magnetic memory cell.

In accordance with other embodiments of the present invention, a magnetic random access memory is provided which comprises a magnetic memory cell connected to a bit line; a first transistor having a source connected to a power supply voltage, a drain connected to the bit line and a gate; a second transistor having a source connected to the power supply voltage, a drain connected to the gate of the first transistor and a gate; a first current path connected between the gates of the first and second transistors and a ground voltage and operated responsive to a first signal; a second current path connected between the gates of the first and second transistors and the ground voltage and operated responsive to a second signal; a first capacitor connected to the bit line; a second capacitor connected to the bit line; and a comparator for comparing data values stored in the first and second capacitors.

In some embodiments of the present invention, the magnetic random access memory can judge data stored in magnetic memory cells without using reference memory cells. A circuit area may be considerably reduced by eliminating reference memory cells. Moreover, it may be possible to improve a yield although a thickness of respective insulation layers in data memory cells is not uniform, because resistance values of reference and data memory cells are not compared.

DETAILED DESCRIPTION

Figure 1:
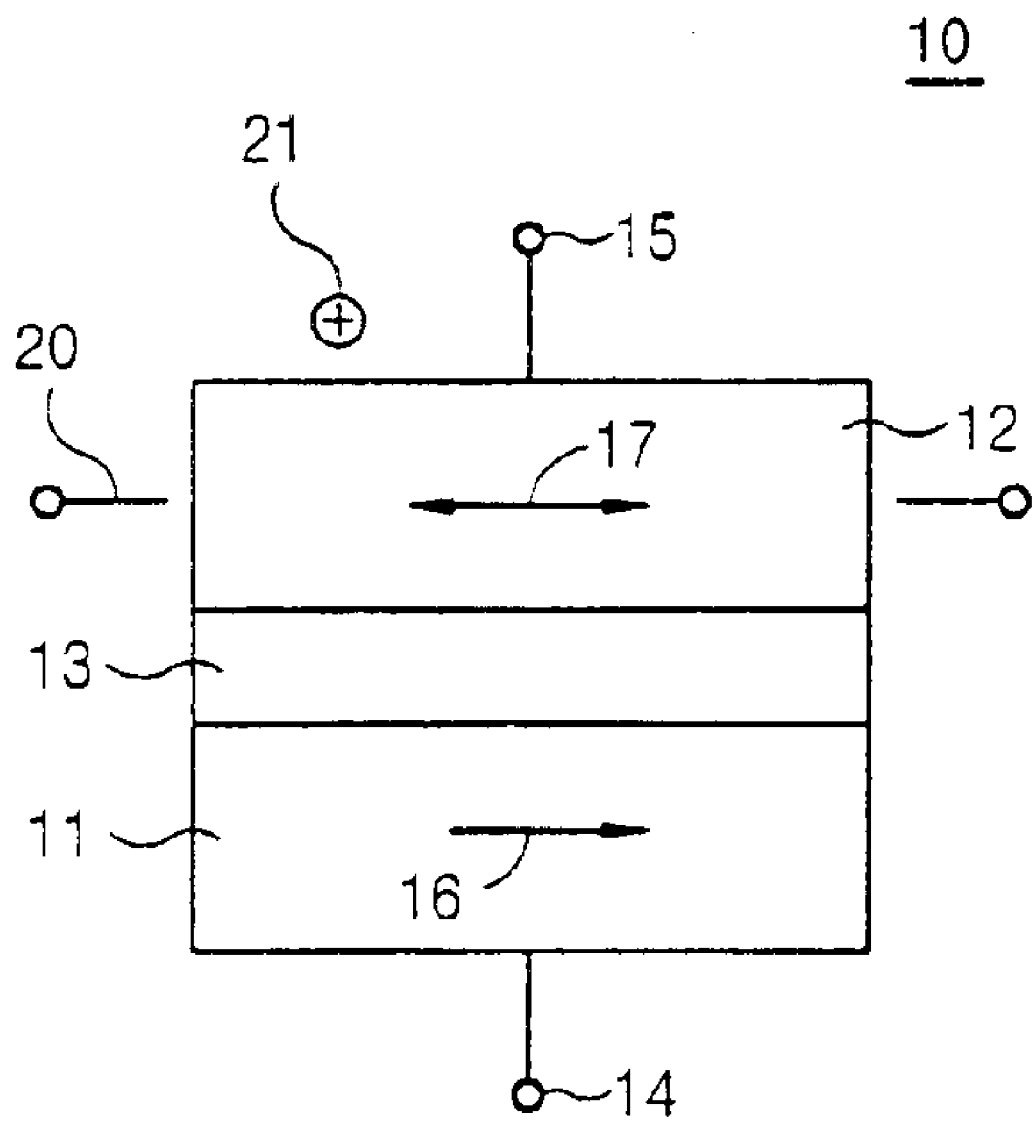
FIG. 1 is a simplified sectional view of a conventional magnetic tunnel junction (MTJ)

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

Figure 2:
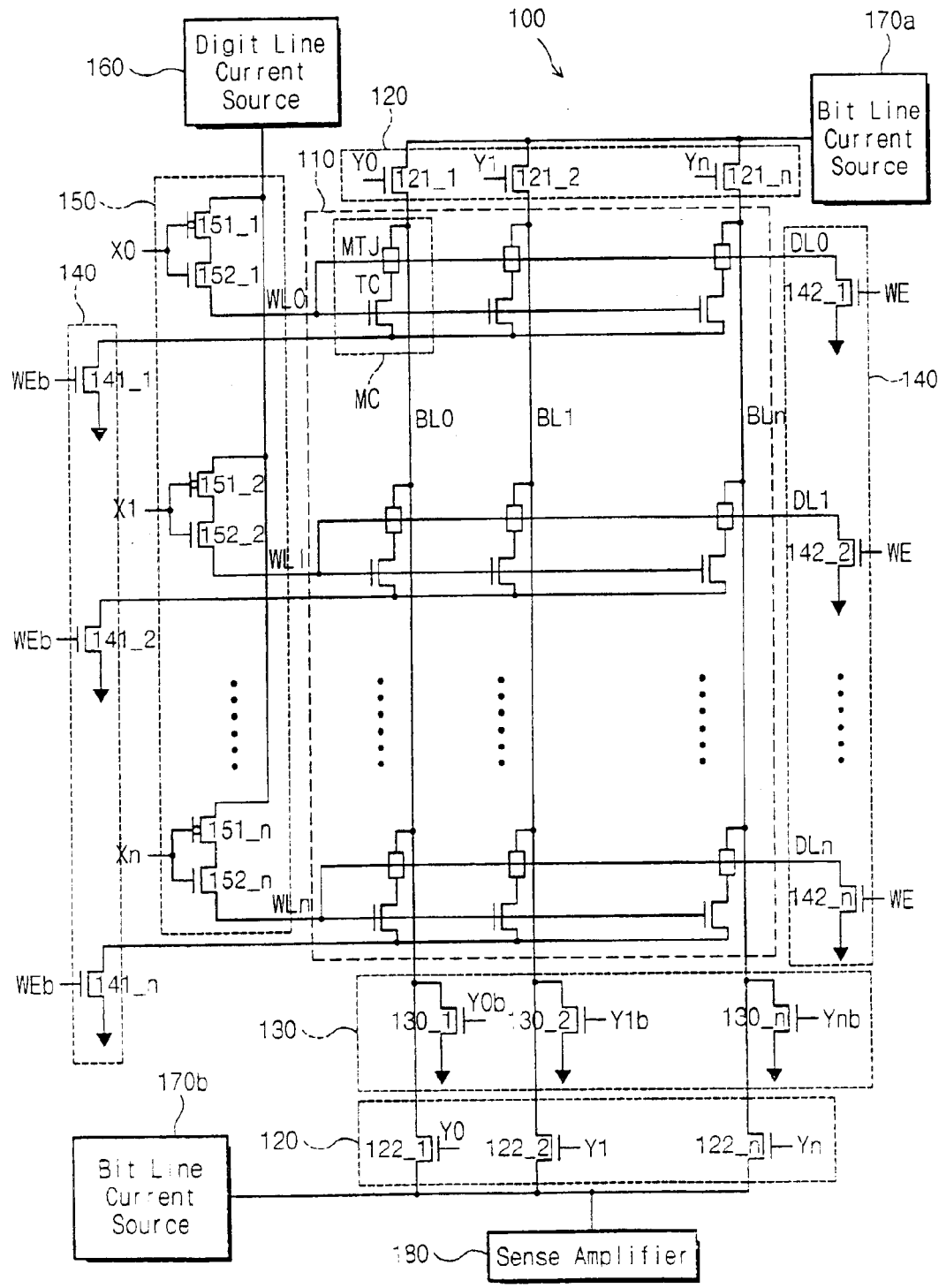
FIG. 2 is a circuit diagram illustrating a magnetic random access memory device according some embodiments of the present invention.

FIG. 2 is a circuit diagram illustrating a magnetic random access memory (MRAM) 100 according to some embodiments of the present invention. As shown in FIG. 2, the MRAM 100 includes a memory cell array 110, a bit line selector circuit 120, a digit line selector circuit 140, a word line selector circuit 150, a digit line current source 160, bit line current sources 170a and 170b, a precharge circuit 130 and a sense amplifier circuit 180. The memory cell array 110 includes a plurality of word lines WL0–WLn, a plurality of bit lines BL0–BLn, a plurality of digit lines DL0–DLn, and a plurality of magnetic memory cells MC arranged in rows and columns at intersections of the lines. Each memory cell MC includes one cell transistor TC and one magnetic tunnel junction (MTJ).

The word line selector circuit 150 includes plural pairs of PMOS and NMOS transistors (151_1, 152_1) to (151_n, 152_n) corresponding to the word lines WL0–WLn, respectively. For example, a pair of transistors 151_1 and 152_1 is cascaded between the digit line current source 160 and a word line WL0 with the gates of transistors 151_1 and 152_1 connected to receive a row address signal X0. Similarly, a pair of transistors 151_n and 152_n is serially connected between the digit line current source 160 and a word line WLn with the gates of transistors 151_n and 152_n connected to receive a row address signal Xn. The word line selector circuit 150 is supplied with current from the digit line current source 160 and selects one of the word lines WL0–WLn in response to row address signals X0–Xn.

The bit line selector circuit 120 includes a plurality of NMOS transistors 121_1 to 121_n and 122_1 to 122_n. The NMOS transistors 121_1 to 121_n whose gates are connected to receive corresponding column address signals Y0–Yn have drains connected in common to the bit line current source 170a and sources connected respectively to corresponding bit lines BL0–BLn. The NMOS transistors 122_1 to 122_n whose gates are connected to receive the column address signals Y0b–Ynb have drains connected in common to the bit line current source 170b and sources connected respectively to corresponding bit lines BL0–BLn. The bit line selector circuit 120 is supplied with current from the bit line current sources 170a and 170b and selects one of the bit lines BL014 BLn in response to the column address signals Y0–Yn.

The digit line selector circuit 140 includes a plurality of NMOS transistors 141_1 to 141_n and 142_1 to 142_n. Each of the transistors 141_1 to 141_n has a drain connected to sources of cell transistors TC of memory cells MC in a corresponding row, a source grounded and a gate connected to receive an inverted version of a write enable signal WEb. Each of the transistors 142_1 to 142_n has a drain connected to a digit line DL0 to DLn connected to a corresponding row of MTJs, a grounded source and a gate connected to receive the write enable signal WE. The digit line selector circuit 140 selects one of the digit lines DL0 to DLn in response to write enable signals WE and WEb and determines a direction of the digit current to the selected digit line.

The precharge circuit 130 includes precharge transistors 130_1 to 130_n corresponding to the bit lines BL0–BLn. The precharge transistors 130_1 to 130_n are connected in parallel between corresponding bit lines and a ground voltage. The transistors 130_1 to 130_n are controlled by corresponding signals Y0b–Ynb. The precharge circuit 130 establishes the bit lines BL0–BLn at the ground voltage when the signals Y0b–Ynb are high.

Figure 3:
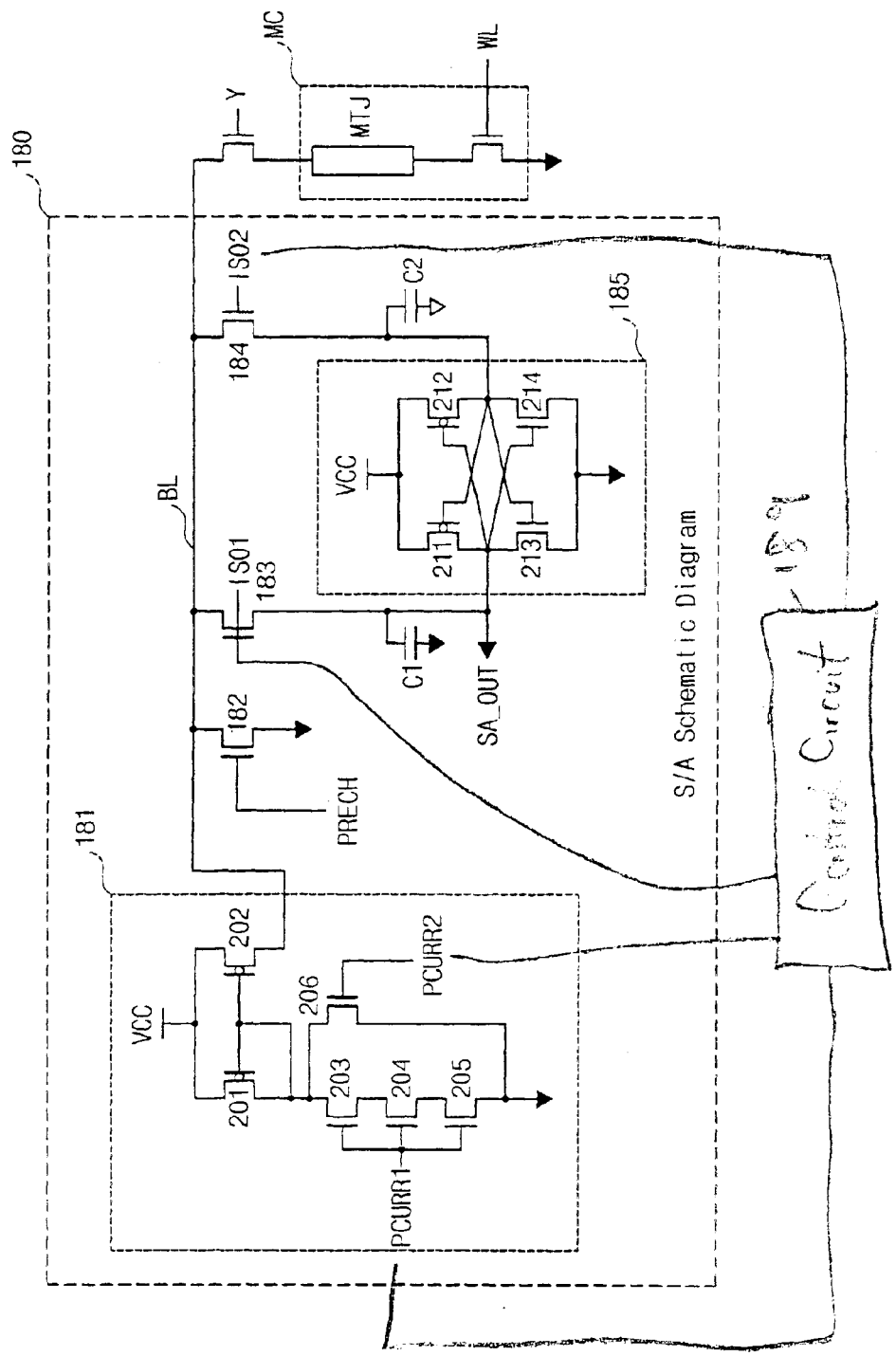
FIG. 3 is a circuit diagram illustrating a sense amplifier circuit according to some embodiments of the present invention.

A detailed circuit diagram of a sense amplifier circuit 180 according to some embodiments of the present invention will now be described with reference to the circuit diagram of FIG. 3. As shown in FIG. 3, the sense amplifier circuit 180 in some embodiments of the present invention includes a current source 181, a precharge transistor 182, switch transistors 183 and 184, capacitors C1 and C2, and a differential amplifier 185.

The current source 181 illustrated in FIG. 3 includes PMOS transistors 201 and 202 and NMOS transistors 203, 204, 205 and 206. The PMOS transistor 201 and the PMOS transistor 202 have sources connected to a power supply voltage VCC. A gate of the PMOS transistor 202 is connected to a gate and a drain of the PMOS transistor 201. A drain of the PMOS transistor 202 is connected to a bit line BL. The NMOS transistors 203–205 are serially connected between the drain of the PMOS transistor 201 and a ground voltage and are commonly controlled by a first current control signal PCURR1. The NMOS transistor 206 is connected between the drain of the PMOS transistor 201 and the ground voltage and is controlled by a second current control signal PCURR2.

The amount of current supplied from the transistor 202 to a bit line BL can be regulated by adjusting channel sizes of the NMOS transistors 203–206. For the illustrated embodiments, assuming that a current of I is supplied from the PMOS transistor 202 when the first and second current control signals PCURR1 and PCURR2 are activated, a current of 0.9I is supplied from the PMOS transistor 202 when the first current control signal PCURR1 is activated and PCURR2 is not. The current difference results as the amount of current generated when the transistors 203–206 are turned on is more than that when the transistors 203–205 are turned on.

The precharge transistor 182 has a drain connected to the bit line BL, a source grounded and a gate connected to receive a precharge signal PRECH. The switch transistor 183 has a drain connected to the bit line BL and a gate connected to receive a switch signal ISO1. The capacitor C1 is connected between a source of the transistor 183 and the ground voltage. A voltage of the bit line BL is stored in the capacitor C1 when the switch signal ISO1 is activated. The switch transistor 184 has a drain connected to the bit line BL and a gate connected to receive a switch signal ISO2. The capacitor C2 is connected between a source of the transistor 184 and the ground voltage. A voltage of the bit line BL is stored in the capacitor C2 when the switch signal ISO2 is activated.

The differential amplifier 185 includes PMOS transistors 211 and 212 and NMOS transistors 213 and 214. The PMOS transistor 211 has a source connected to the power supply voltage VCC, a drain connected to the gate of the PMOS transistor 212 and a gate connected to the drain of the PMOS transistor 212. The PMOS transistor 212 has a source connected to the power supply voltage VCC, a drain connected to the gate of the PMOS transistor 211 and a gate connected to the drain of the PMOS transistor 211. The NMOS transistor 213 has a drain connected to the drain of the PMOS transistor 211, a source grounded and a gate connected to the drain of the PMOS transistor 212. The NMOS transistor 214 has a drain connected to the drain of the PMOS transistor 212, a source grounded and a gate connected to the drain of the PMOS transistor 211. The differential amplifier 185 senses a difference between voltages stored in the capacitors C1 and C2 to output a data signal SA_OUT.

Also shown in FIG. 3 is a control circuit 189 that generates control signals to control the current source circuit 181 to supply current to the magnetic memory cell MC and to control coupling of the capacitors C1, C2 to the bit line BL. As shown in the embodiments of FIG. 3, the control circuit 189 generates the control signals PCURR1, PCURR2, ISO1 and ISO2. However, it is to be understood that the control circuit 189 may also generate other control signals for the magnetic memory device, which will not be described further herein as such operations need not be detailed to appreciate the scope of the present invention.

Figure 4:
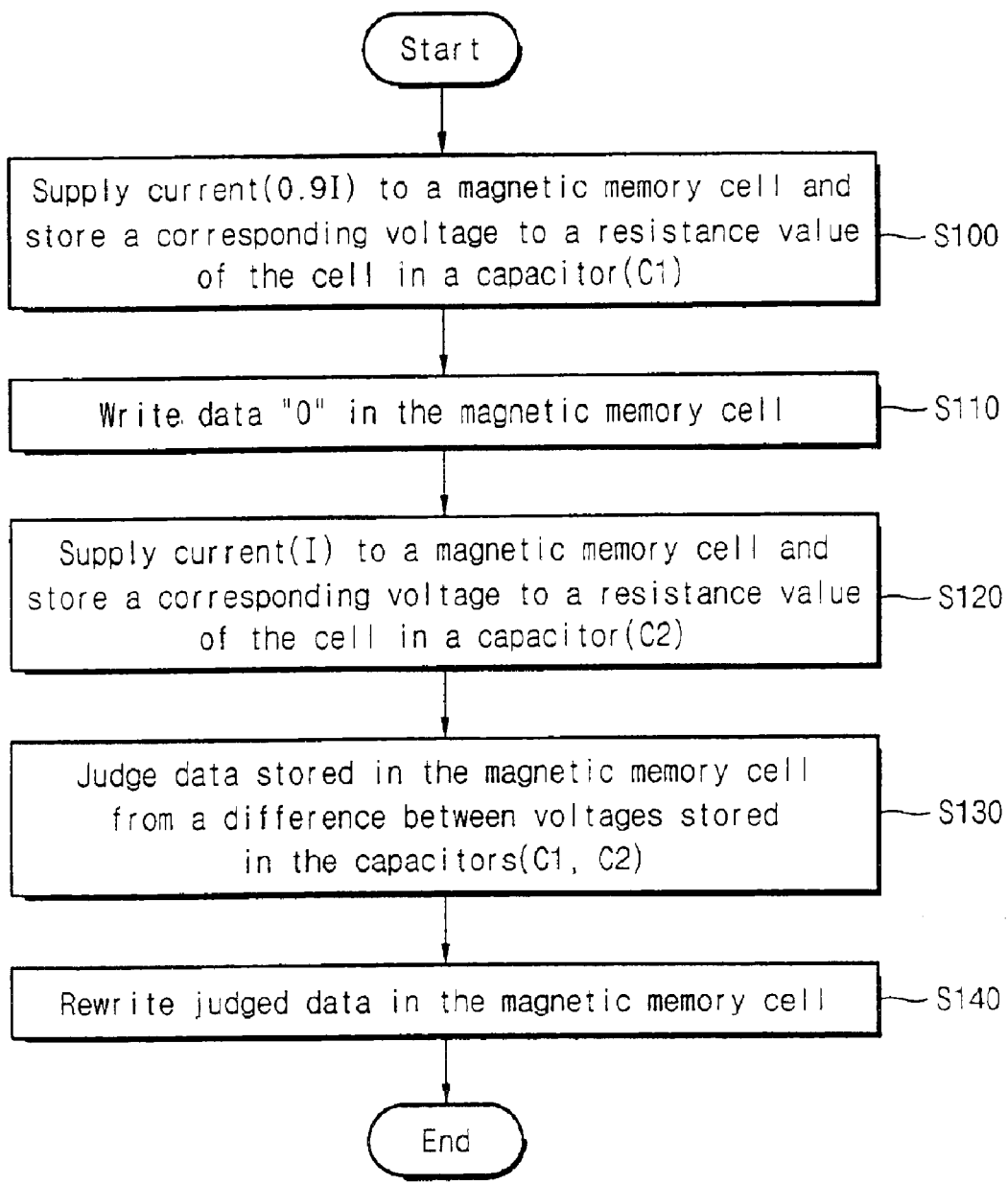
FIG. 4 is a flowchart illustrating a control procedure of the sense amplifier circuit of FIG. 3 according to some embodiments of the present invention.
Figure 5:
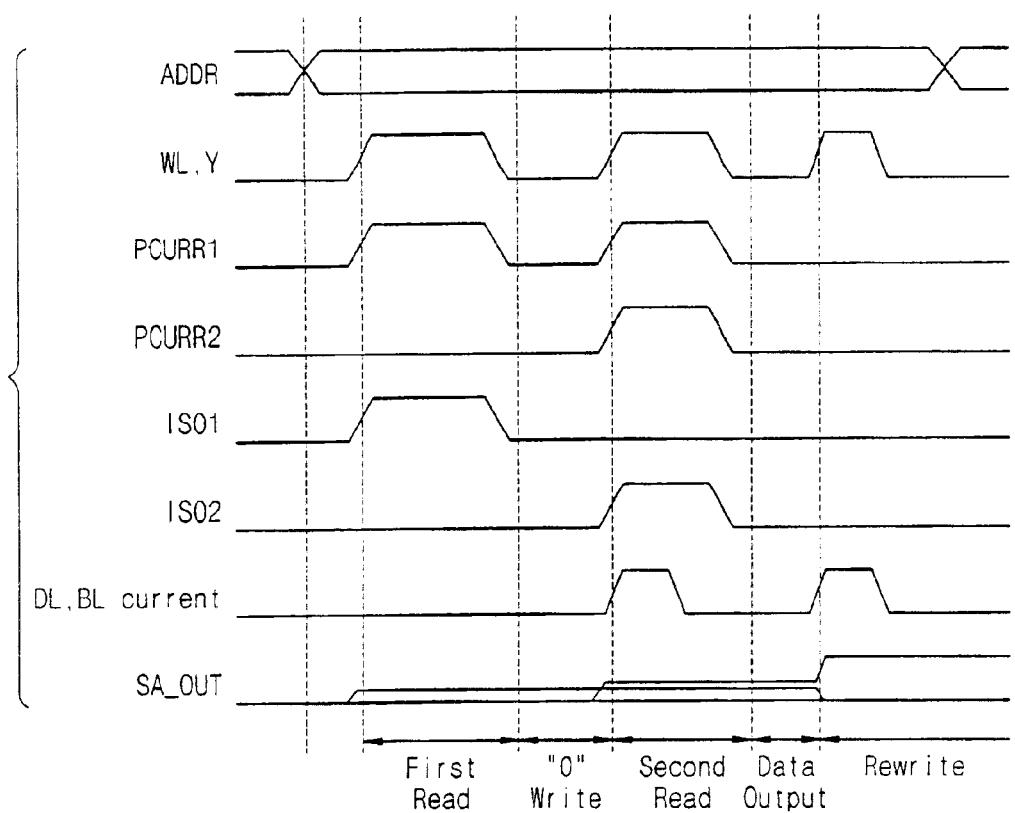
FIG. 5 is a timing diagram illustrating a sense operation for the sense amplifier circuit of FIG. 3 according to some embodiments of the present invention.

Operations of embodiments of the present invention will now be described for an MRAM 100 as illustrated in FIGS. 2 and 3. FIG. 4 is a flowchart illustration of embodiments of a control procedure for the sense amplifier circuit 180 shown in FIG. 3. FIG. 5 is a timing diagram illustrating a sense operation for the sense amplifier circuit 180 shown in FIG. 3.

Operations begin at block S100, when a first current control signal PCURR1 is activated and the current source 181 supplies a current of 0.9I to a magnetic memory cell MC selected responsive to row and column address signals X0–Xn and Y0–Yn. As described above, when the NMOS transistors 203–206 are turned on, a current of I is supplied to a bit line BL from the PMOS transistor 202. When the NMOS transistor 206 is turned off and the NMOS transistors 203–205 are turned on, a current of 0.9I is supplied to the bit line BL from the PMOS transistor 202. At the same time, the switch signal ISO1 is activated and the switch transistor 183 is turned on. As a result, a voltage of the bit line BL corresponding to a resistance value of MTJ of the selected memory cell MC is stored in the capacitor C1.

As shown at block S110, a data value of "0" is written in the selected memory cell MC. The "0" data is written in the selected memory cell MC by supplying a current to a digit line in a direction so that magnetizations of magnetic layers in the selected memory cell are parallel.

As shown at block S120, when current control signals PCURR1 and PCURR2 are activated, the current source 181 supplies a current of I to the magnetic memory cell MC selected responsive to row and column address signals X0–Xn and Y0–Yn. As described above, when the NMOS transistors 203–206 are turned on, a current of I is supplied to a bit line BL from the PMOS transistor 202. At the same time, the switch signal ISO2 is activated and the switch transistor 184 is turned on. As a result, a voltage of the bit line BL corresponding to a resistance value of MTJ of the selected memory cell MC is stored in the capacitor C2.

Referring now to block S130, the differential amplifier 185 senses a difference between voltages stored in the capacitors C1 and C2 and outputs a data signal SA_OUT based on the sensed voltage difference.

Figure 6A:
FIGS. 6A and 6B are diagrams illustrating voltages stored in capacitors C1 and C2 associated with data stored in a selected magnetic memory cell.
Figure 6B:
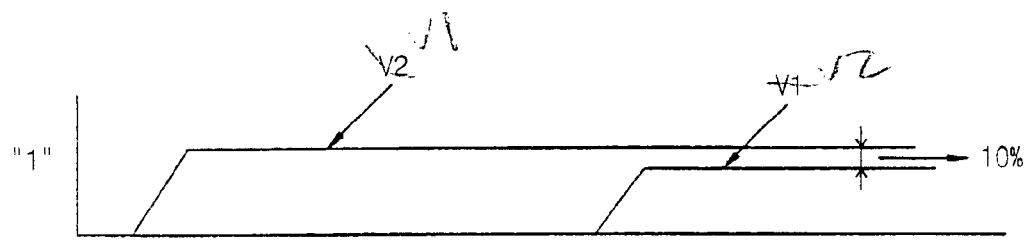

The operations as described will now be further explained with reference to FIGS. 6A and 6B. FIGS. 6A and 6B show voltages stored in capacitors C1 and C2 based on data stored in a selected magnetic memory cell. Assume that when data level "0" is stored in a selected magnetic memory cell MC, a resistance of a magnetic tunnel junction MTJ of a selected cell MC is "RP." With this assumption, a voltage V1 stored in the capacitor C1 is "0.9I*RP" in a first read operation (block S100) and a voltage V2 stored in the capacitor C2 is "I*RP" in a second read operation (block S120). Thus, V1 is less than V2.

Assume that when data level "1" is stored in a selected magnetic memory cell MC, a resistance of a magnetic tunnel junction MTJ of a selected cell MC is "RA." With this assumption, the voltage V1 in the capacitor C1 is "0.9I*RA" in the first read operation (block S100). The resistance of a magnetic tunnel junction MTJ of the selected cell MC is "RP" when data level "0" is stored in the cell MC during the write operation (block S110). The voltage V2 in the capacitor C2 is "I*RP" in the second read operation (block S120). As described above, a resistance of the MTJ becomes a minimum value when the magnetization orientation of the MTJ is parallel and a maximum value when the magnetization orientation of the MTJ is anti-parallel (in other words, RA is greater than RP). Thus, given the magnitude of the resistance difference, V1 is greater than V2.

As described above, data in a magnetic memory cell MC may be sensed (judged) from voltages V1 and V2 stored in capacitors C1 and C2. That is, when a data level "1" is stored in a magnetic memory cell MC, a voltage V1 in a capacitor C1 is higher than a voltage V2 in a capacitor C2. When V1 is higher than V2, the sense amplifier 180 outputs a data signal SA_OUT of a logic high ("1") level. When a data level "0" is stored in a magnetic memory cell MC, a voltage V1 in a capacitor C1 is lower than a voltage V2 in a capacitor C2. When V1 is lower than V2, the sense amplifier 180 outputs a data signal SA_OUT of a logic low ("0") level. Therefore, it is possible to read data stored in a magnetic memory cell without using a reference cell.

Referring again to FIG. 4, at block S140, the data signal SA_OUT from the sense amplifier 180 is rewritten in the selected magnetic memory cell MC. The rewrite is provided as the data read operation described above is a destructive read operation where a data level "0" is written between charging of the capacitors C1 and C2, which overwrites the originally stored data. The rewrite operation rewrites the originally stored data in a magnetic memory cell.

Figure 7A:
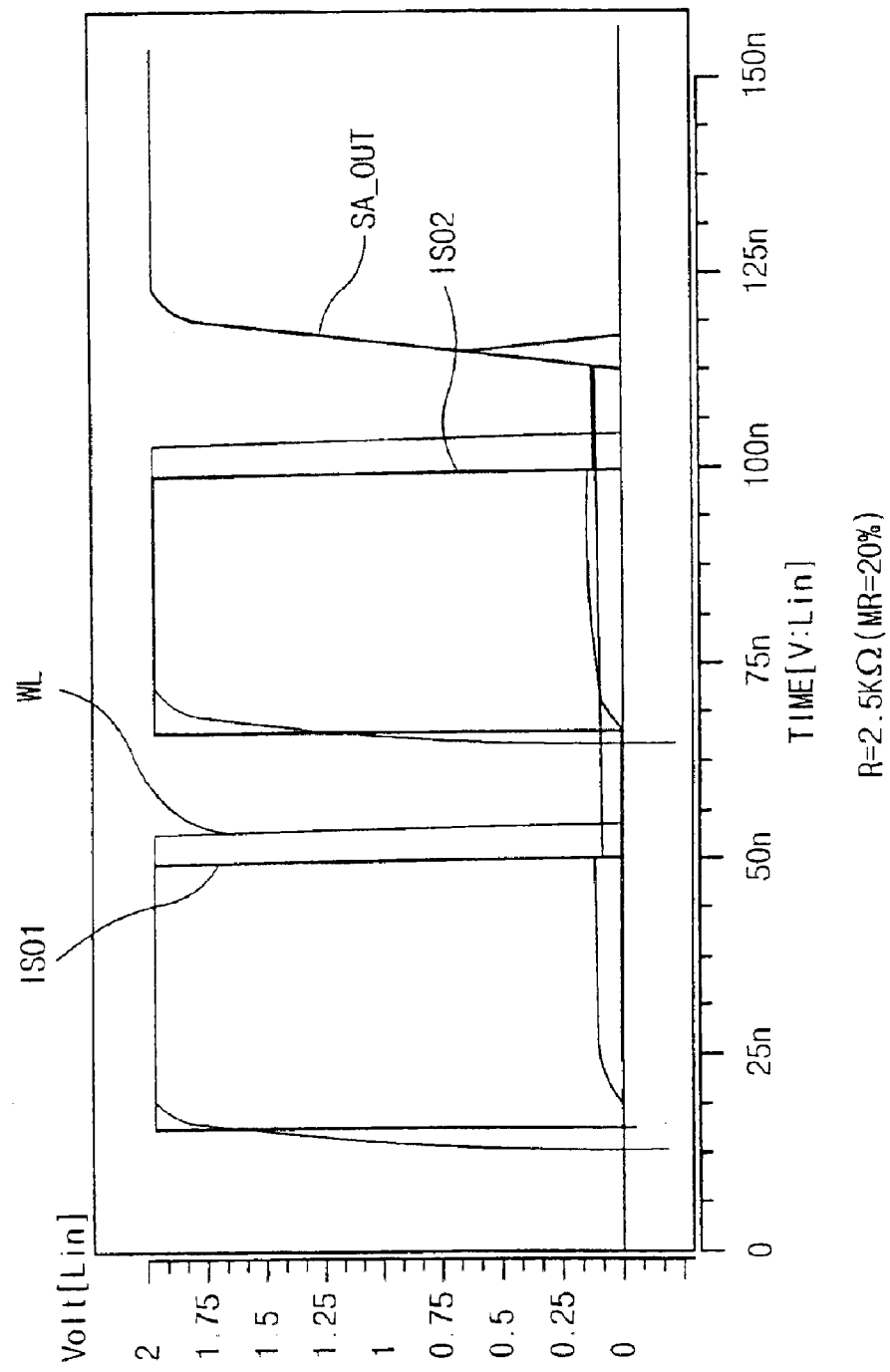
FIGS. 7A and 7B are diagrams illustrating simulation results obtained when a resistor is used instead of a magnetic tunnel junction in a magnetic memory cell.
Figure 7B:
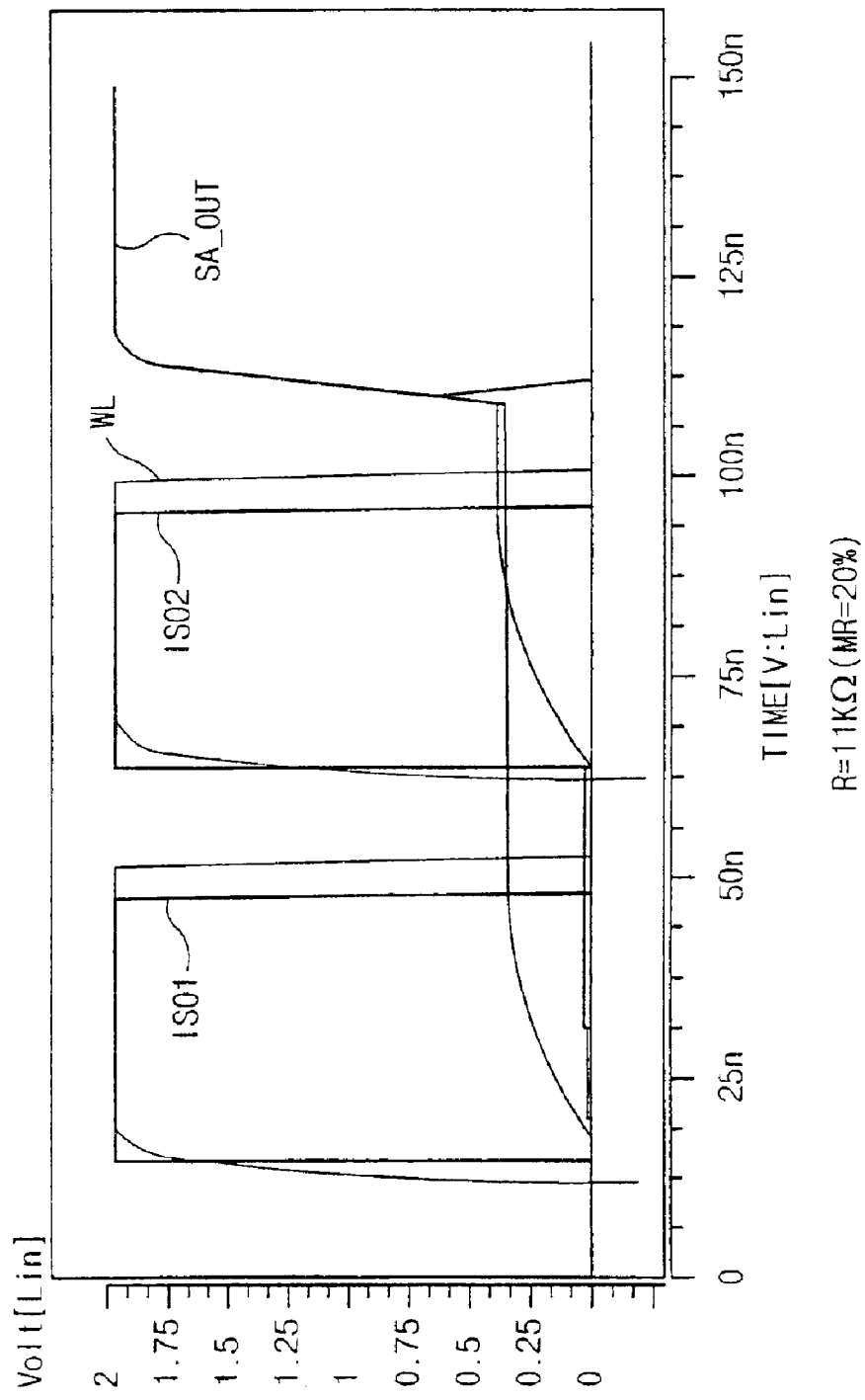

FIGS. 7A and 7B are diagrams illustrating simulation results obtained using a resistor instead of a magnetic tunnel junction in a magnetic memory cell. In particular, FIG. 7A shows a data signal SA_OUT from a sense amplifier circuit 180 when a resistor of 2.5 KΩ is used instead of a magnetic tunnel junction. A magnetoresistive ratio is within 20%. FIG. 7B shows a data signal SA_OUT from a sense amplifier circuit 180 when a resistor of 11 KΩ is used instead of a magnetic tunnel junction. Likewise, a magnetoresistive ratio is within 20%. As understood from FIGS. 7A and 7B, although the resistance is changed from 2.5KΩ to 11KΩ, the sense amplifier circuit 180 correctly senses data stored in a memory cell where the magnetoresistive ratio of 20% is satisfied.

As described above, embodiments of a magnetic random access memory according to the present invention can judge data stored in magnetic memory cells without using reference memory cells. In addition, a circuit area of such memory cells may be considerably reduced by eliminating reference memory cells. It is also possible to improve a yield of a device including such memory cells even where a thickness of respective insulation layers in data memory cells is not uniform as resistance values of reference and data memory cells are not compared.

While this invention has been particularly shown and described with reference to typical embodiments thereof, it will be understood by those skilled in the art that various changes in form and details may be made therein without departing from the spirit and scope of the invention as defined by the appended claims.

What is claimed is:

1. A data sensing circuit for a magnetic memory cell, comprising:

a current source circuit that selectively supplies a current to the magnetic memory cell;

a first storage device selectively coupled to the magnetic memory cell that is configured to store a voltage representing a state of the magnetic memory cell;

a second storage device selectively coupled to the magnetic memory cell that is configured to store a voltage representing a state of the magnetic memory cell;

a differential voltage sense circuit coupled to the first and second storage devices that generates a sensed data output signal for the magnetic memory cell responsive to sensing a difference between voltages stored in the first and second storage devices; and a control circuit that generates control signals to control the current source to supply current to the magnetic memory cell and to control the coupling of the first and second storage devices to the magnetic memory cell;

wherein the current source circuit is configured to selectively apply a first current or a second current different from the first current responsive to a control signal from the control circuit and wherein the current source circuit comprises:

a plurality of transistors having serially connected current paths and gates connected to receive a first control signal;

a first transistor having a gate connected to receive a second control signal;

a second transistor coupled to the plurality of transistors and the first transistor;

a third transistor coupled to the magnetic memory cell having a gate coupled to a gate and a drain of the second transistor; and wherein the first current or the second current is selected by selective activation of the first and second control signal.

2. The data sensing circuit of claim 1 wherein the differential voltage sense circuit comprises a differential amplifier.

3. The data sensing circuit of claim 1 further comprising a first switch transistor selectively coupling the first storage device to the magnetic memory cell and a second switch transistor selectively coupling the second storage device to the magnetic memory cell and wherein the control circuit is configured to generate control signals coupled to the switch transistors to control the coupling of the first and second storage devices to the magnetic memory cell.

4. The data sensing circuit of claim 3 wherein the first storage device comprises a capacitor coupled to the first switch transistor and the second storage device comprise a capacitor coupled to the second switch transistor.

5. The data sensing circuit of claim 1 wherein the magnetic memory cell comprises a magnetic tunnel junction.

6. The data sensing circuit of claim 5 wherein the control circuit is configured to selectively couple the first storage device to the magnetic memory cell to store a voltage representing a data state of the magnetic memory cell to be sensed and to selectively couple the second storage device to the magnetic memory cell to store a voltage representing a known data state of the magnetic memory cell.

7. The data sensing circuit of claim 6 wherein the control circuit is configured to select the first current when the first storage device is coupled to the magnetic memory cell and the second current when the second storage device is coupled to the magnetic memory cell.

8. A magnetic memory device including a plurality of magnetic memory cells and the data sensing circuit of claim 1.

9. A data sensing circuit for a magnetic memory cell, comprising:

a current source circuit that selectively supplies a first current or a second current different from the first current to the magnetic memory cell;

a first storage device selectively coupled to the magnetic memory cell that is configured to store a voltage representing a state of the magnetic memory cell;

a second storage device selectively coupled to the magnetic memory cell that is configured to store a voltage representing a state of the magnetic memory cell;

a differential voltage sense circuit coupled to the first and second storage devices that generates a sensed data output signal for the magnetic memory cell responsive to sensing a difference between voltages stored in the first and second storage devices; and a control circuit that generates control signals to control the current source to supply current to the magnetic memory cell and to control the coupling of the first and second storage devices to the magnetic memory cell;

wherein the control circuit is configured to selectively couple the first storage device to the magnetic memory cell to store a voltage representing a data state of the magnetic memory cell to be sensed and to selectively couple the second storage device to the magnetic memory cell to store a voltage representing a known data state of the magnetic memory cell and wherein the control circuit is configured to select the first current when the first storage device is coupled to the magnetic memory cell and the second current when the second storage device is coupled to the magnetic memory cell; and wherein the first current is lower than the second current and wherein the voltage stored in the first storage device is lower than the voltage stored in the second storage device when the data state of the magnetic memory cell corresponds to the known data state and wherein the voltage stored in the first storage device is greater than the voltage stored in the second storage device when the data state of the magnetic memory cell differs from the known data state.

10. A magnetic memory device including a plurality of magnetic memory cells and the data sensing circuit of claim 9.

11. A method of sensing data stored in a magnetic memory cell comprising:

supplying a first current to the magnetic memory cell to sense a first voltage corresponding to a resistance of the magnetic memory cell with the data stored in the magnetic memory cell;

storing determinate data in the magnetic memory cell;

supplying a second current to the magnetic memory cell to sense a second voltage corresponding to a resistance of the magnetic memory cell with the determinate data stored in the magnetic memory cell after storing the determinate data, wherein the first current is about 90 percent of the second current; and sensing the data stored in the magnetic memory cell based on a difference between the first voltage and the second voltage.

12. The method of claim 11 wherein sensing the data is followed by rewriting the sensed data in the magnetic memory cell.

13. The method of claim 11 wherein the determinate data is a "0" and wherein the first voltage is higher than the second voltage when the data stored in the magnetic memory cell is a "1".

14. The method of claim 11 wherein the determinate data is a "0" and wherein the second voltage is higher than the first voltage when the data stored in the magnetic memory cell is a "0".

15. A data sensing circuit in a magnetic random access memory having a magnetic memory cell, the data sensing circuit comprising:

current source means for supplying a first current and/or a second current to the magnetic memory cell responsive to control signals;

first storage means for storing a first voltage corresponding to a resistance of the magnetic memory cell in response to a first switch signal;

second storage means for storing a second voltage corresponding to a resistance of the magnetic memory cell in response to a second switch signal; and differential amplifier means for sensing data stored in the magnetic memory cell using a difference between the first voltage and the second voltage; and wherein the current source means comprises:

a first transistor having a source connected to a power supply voltage, a drain and a gate, the drain and gate of the first transistor being connected to each other;

a second transistor having a source connected to the power supply voltage, a drain and a gate connected to the gate and drain of the first transistor;

a plurality of third transistors having current paths cascaded between the drain of the first transistor and a ground voltage and gates connected to receive a first control signal; and a fourth transistor having a current path formed between the drain of the first transistor and the ground voltage and a gate connected to receive a second control signal, a current from the drain of the second transistor being supplied to the magnetic memory cell.

16. The data sensing circuit of claim 15 wherein the first storage means comprises:

a switch transistor having a drain connected to the current source and the magnetic memory cell, a source and a gate connected to receive the first switch signal; and a capacitor connected between the source of the switch transistor and the ground voltage.

17. The data sensing circuit of claim 15 wherein the second storage means comprises:

a switch transistor having a drain connected to the current source and the magnetic memory cell, a source and a gate connected to receive the second switch signal; and a capacitor connected between the source of the switch transistor and the ground voltage.

18. The data sensing circuit of claim 15 wherein the first switch signal is activated when the first current from the current source is supplied to the magnetic memory cell.

19. The data sensing circuit of claim 15 wherein the second switch signal is activated when the second current from the current source is supplied to the magnetic memory cell.

20. The data sensing circuit of claim 15 wherein when the first voltage is higher than the second voltage, the differential amplifier means senses that data stored in the magnetic memory cell is '1'.

21. The data sensing circuit of claim 15 wherein when the first voltage is lower than the second voltage, the differential amplifier means senses that data stored in the magnetic memory cell is '0'.

22. A magnetic random access memory comprising:

a magnetic memory cell connected to a bit line;

a first transistor having a source connected to a power supply voltage, a drain connected to the bit line and a gate;

a second transistor having a source connected to the power supply voltage, a drain connected to the gate of the first transistor and a gate;

a first current path connected between the gates of the first and second transistors and a ground voltage and operated responsive to a first signal;

a second current path connected between the gates of the first and second transistors and the ground voltage and operated responsive to a second signal;

a first capacitor connected to the bit line;

a second capacitor connected to the bit line; and a comparator that compares data values stored in the first and second capacitors.

* * * * *